United States Patent [19]
Rostoker

[11] Patent Number: 5,561,086
[45] Date of Patent: Oct. 1, 1996

[54] TECHNIQUES FOR MOUNTING SEMICONDUCTOR DIES IN DIE-RECEIVING AREAS HAVING SUPPORT STRUCTURE HAVING NOTCHES

[75] Inventor: Michael D. Rostoker, Boulder Creek, Calif.

[73] Assignee: LSI Logic Corporation, Milpitas, Calif.

[21] Appl. No.: 412,597

[22] Filed: Mar. 27, 1995

Related U.S. Application Data

[63] Continuation of Ser. No. 79,301, Jun. 18, 1993, abandoned.

[51] Int. Cl.⁶ .................................................. H01L 21/48
[52] U.S. Cl. ...................... 437/220; 437/209; 437/214; 437/215; 437/219; 257/666; 257/670; 257/676; 257/730; 257/773; 257/784
[58] Field of Search ............................. 437/209, 220, 437/215, 214, 219; 257/660, 670, 676, 730, 773, 784

[56] References Cited

U.S. PATENT DOCUMENTS

| | | | |
|---|---|---|---|
| 3,169,837 | 2/1965 | Moross et al. | 29/183 |
| 4,253,280 | 3/1981 | Du Bois et al. | 51/283 R |
| 4,413,404 | 11/1983 | Burns | 29/590 |
| 4,542,397 | 9/1985 | Biegelsen et al. | 357/32 |
| 4,714,952 | 12/1987 | Takekawa et al. | 257/666 |
| 4,771,330 | 9/1988 | Long | 357/80 |
| 4,903,114 | 2/1990 | Aoki et al. | 357/70 |
| 4,918,614 | 4/1990 | Modarres et al. | 364/490 |
| 5,051,807 | 9/1991 | Morozumi | 357/40 |
| 5,096,852 | 3/1992 | Hobson | 437/220 |
| 5,096,853 | 3/1992 | Yasunaga et al. | 437/211 |
| 5,168,368 | 12/1992 | Gow et al. | 257/666 |
| 5,173,369 | 12/1992 | Kataoka | 428/620 |
| 5,182,233 | 1/1993 | Inoue | 437/226 |
| 5,233,222 | 8/1993 | Lamson et al. | 257/666 |
| 5,309,019 | 5/1994 | Moline et al. | 257/773 |
| 5,329,157 | 7/1994 | Rosotker | 257/666 |
| 5,340,772 | 8/1994 | Rosotker | 437/226 |
| 5,365,409 | 11/1994 | Kwon et al. | 257/666 |
| 5,386,141 | 1/1995 | Liang et al. | 257/676 |

FOREIGN PATENT DOCUMENTS

| | | | |
|---|---|---|---|
| 0247644A1 | 12/1987 | European Pat. Off. | 23/48 |
| 0259222A2 | 3/1988 | European Pat. Off. | 23/50 |
| 0311513A2 | 4/1989 | European Pat. Off. | 23/50 |
| 3048362A1 | 7/1982 | Germany | 21/78 |
| 0046578 | 4/1980 | Japan | 437/220 |
| 56-7471A | 1/1981 | Japan | 29/6 |
| 56-58234A | 5/1981 | Japan | 21/30 |
| 56-122175A | 9/1981 | Japan | 33/90 |
| 57-143844 | 9/1982 | Japan | 21/78 |
| 58-207646A | 12/1983 | Japan | 21/60 |
| 0027537 | 2/1984 | Japan | 437/209 |
| 1-270245A | 10/1989 | Japan | 21/78 |
| 0050471 | 2/1990 | Japan | 437/209 |
| 0031453 | 2/1990 | Japan | 437/219 |
| 3-280448A | 12/1991 | Japan | 21/78 |
| 4-162640 | 6/1992 | Japan | 21/60 |
| 2196475 | 4/1988 | United Kingdom | 23/30 |

OTHER PUBLICATIONS

Rao Tummala, et al., "Microelectronics . . . Handbook", Van Nostrand Reinhold, pp. 391–398, 1989.

Primary Examiner—George Fourson
Assistant Examiner—Long Pham
Attorney, Agent, or Firm—Katz & Cotton, LLP

[57] ABSTRACT

In cases where there are at least some large gaps between edges of a semiconductor die and the inner ends of package conductors defining a die-receiving area, one or more bond wire support structure are disposed in the gap, thereby causing a long bond wire to behave as two or more shorter bond wires. The bond wires are tacked to a top surface of the support structure by various alternative means. Alternatively, a "jumper" structure having conductive traces of graduated length can be disposed in the die-receiving area between the die and the edges of the die-receiving area, providing an intermediate connection between the die and the leads of the package, thereby permitting short bond wires to be used in lieu of long bond wires.

11 Claims, 5 Drawing Sheets

TECHNIQUES FOR MOUNTING SEMICONDUCTOR DIES IN DIE-RECEIVING AREAS HAVING SUPPORT STRUCTURE HAVING NOTCHES

This application is a continuation of application Ser. No. 08/079,301, filed Jun. 18,1993, entitled "TECHNIQUES FOR MOUNTING SEMICONDUCTOR DIES IN DIE-RECEIVING AREAS HAVING A SHAPE DIFFERING FROM THAT OF THE DIE" by Michael D. Rostoker, now abandoned.

TECHNICAL FIELD OF THE INVENTION

The invention relates to integrated circuit packaging techniques, and more particularly to the formation of electrical connections with semiconductor dies.

BACKGROUND OF THE INVENTION

Trends in modern integrated circuitry are generally towards smaller size (miniaturization) and greater function (increased circuit density). Generally, greater functionality indicates a required increase in input/output (I/O) connections (e.g., bond pads) on the die. As integrated circuit devices become smaller and their function increases, the need arises for improved methods of forming large numbers of connections between an integrated circuit die and its package. Traditional techniques for connecting (e.g., a lead frame, or the like) to a semiconductor die include wire bonding and tape-automated bonding. Generally, both of these techniques are relatively large in scale as compared with the bond pads on the die, and are not shrinking significantly. Hence, generally, techniques for connecting to a semiconductor die are not keeping apace of integrated circuit miniaturization.

The number of external interface (e.g., I/O) signals on integrated circuit dies has increased steadily to a point where it is not uncommon to find 200 or more "pins" (i.e., I/O connections) on modern integrated circuits, particularly on very large-scale integrated circuits such as high-end microprocessors. Miniaturization demands that these increasing numbers of connections be formed in ever-smaller areas.

Another trend in modern integrated circuits has been toward providing larger numbers of external interface (I/O) signals for a given amount of circuitry. While decreasing semiconductor device geometries (increasing circuit densities) have accommodated demands for greater amounts of circuitry in a given semiconductor die area, I/O signals are generally limited in number by the space along the periphery (edges) of the die. This is because "bond pads" to which external I/O signal connections are made, are typically placed along the edges of the die. While some attempts have been made to utilize portions of the interior area of the die for bond pads, problems associated with long bond wire runs and bond wires crossing over other bond wires tend to render these approaches cumbersome and impractical.

Co-pending commonly owned U.S. patent application Ser. No. 07/916,328 filed Jul. 17, 1992 by Rostoker, now U.S. Pat. No. 5,340,772 (hereinafter ROS1) describes a technique whereby greater numbers of bond pads per unit of semiconductor die area can be achieved by making use of "certain non-square" die shapes such as triangle shapes, trapezoidal shapes, greatly elongated rectangular shapes, parallelogram shapes, etc.. Compared to low-aspect ratio rectangular shaped or square semiconductor dies, these certain non-square die shapes exhibit an inherently greater ratio of edge length to surface area, permitting more bond pads to be placed in the peripheral area of the die (just inside the edges thereof) per unit of die area.

Conventional integrated circuit packages commonly have a square or low-aspect ratio rectangular "die-receiving area". The die-receiving area, into which a semiconductor die is mounted, is generally defined as the area described (contained within) the inner ends of conductive lead fingers (or conductive traces) of the package (or leadframe).

The conductive traces (e.g., lead fingers) of a semiconductor package extend outward from the die-receiving area, ultimately ending at and providing electrical connection to the external leads, pins or the like of the semiconductor package. In some cases, the conductive traces of the package radiate (fan) outward from the die-receiving area, being most closely packed where they are closest to the die. The physical constraints on trace size and pitch (spacing) clearly limit how many traces can fit adjacent to the die-receiving area. It is known, that by terminating some or all of the traces at a distance from the die-receiving area, the number of traces can be increased. However, when connecting a bond wire between the die and the trace, the lengths involved can quickly become unacceptable.

Copending, commonly-owned U.S. patent application Ser. No. 07/933,430 filed Aug. 21, 1992 by Rostoker, now U.S. Pat. No. 5,329,157 (hereinafter ROS2) describes semiconductor packages with "certain non-square" die-receiving areas to accommodate certain non-square die shapes, such as those described in ROS1. ROS2 provides for highly optimal mounting and connection arrangements for certain non-square dies which are particularly well suited to mounting non-square dies by matching the shape of the die-receiving area, as defined by the inner ends of the conductive traces, to the (certain non-square) shape of the die.

Irrespective of the type of package (e.g., conventional or ROS2-type packages) and style of die mounting, the semiconductor die must be connected to inner ends of the conductive lead fingers in the package. One well-known way to effect this connection is by using bond wires attached at one end to bond pads on the die, and attached at their other end to the inner ends of the lead fingers. Bond wires are on the order of one thousandth of an inch, or less, in diameter. Bond pads are on the order of a few thousandths of an inch, spaced from one another on the order of one thousandth of an inch. Evidently, when many bond wires are connected to a die, this is a very crowded situation, and there is the possibility of these bond wires shorting against one another, breaking, and other related problems. This problem is exacerbated in plastic molded packaging, wherein a die is mounted to a lead frame, wire bonded thereto, inserted into a mold, and covered with plastic. The influx of plastic into the mold can cause movement of the closely-spaced bond wires, resulting in a defective packaged component. Coming this late in the process (during packaging), defects due to bond failure are generally irreversible and expensive. Semiconductor die shape notwithstanding, the trend in microelectronics towards smaller, denser semiconductor dies with more input/output (I/O) connections causes increased difficulty in packaging such dies, especially in plastic packages, due to lead frame and bonding limitations.

There is a tremendous hesitancy in the semiconductor industry to use "non-standard" packages or packaging equipment, largely due to issues of tooling, capital equipment cost and training. In other words, the familiar is favored over the unfamiliar. This means that, at least in the short-term, the industry could find it advantageous to package the "certain non-square" dies of ROS1 in conventional packages, rather than in the non-conventional packages of ROS2. Unfortunately, the shape mismatch between the "certain non-square" dies of ROS1 and the die-receiving areas of conventional packages inevitably creates situations where some "bond wires" between bond pads on the (certain non-square) semiconductor die and the die-receiving area of the package are "unacceptably" long. Such bond wires become "unacceptably" long when there is a significant danger of shorting between adjacent bond wires.

Having overly long bond wires can cause other problems besides shorting together. For example, bond wires, as mentioned hereinabove, are extremely fine wires of about 0.001 inches in diameter. At extended lengths (e.g., twice "normal"), such bond wires can exhibit sufficient resistance to cause voltage drops when carrying current. Further, the increased resistance exhibited by long bond wires can interact with parasitic capacitances in the die and/or the package to cause RC (resistive-capacitive) delays, thereby slowing the operation of the packaged die. Inconsistent wire lengths can also contribute to signal "skewing" due to differential signal delay times experienced by one lead of the package vis-a-vis other leads.

SUMMARY OF THE INVENTION

It is therefore an object of the present invention to provide an improved technique for packaging semiconductor dies.

It is another object of the present invention to provide a technique for adapting a semiconductor die having one shape (for example, certain non-square) to a die-receiving area having a substantially different shape (e.g., square or rectangular).

It is a further object of the present invention to alleviate problems associated with long lengths of bond wire, for example as necessitated by a shape mismatch between a die and a die-receiving area.

It is a further object of the present invention to prevent shorting between adjacent long bond wires.

According to the present invention, a shape mismatch between a semiconductor die and a die-receiving area defined by inner ends of conductive traces (e.g., leadframe leads) in an integrated circuit package results in gaps (distances) of varying (typically graduated) size between sides (edges) of the die and sides (boundaries) of the die-receiving area. A lead support structure is provided between the die and the inner ends of the conductive lead fingers of the conductive leads of the package. Intermediate portions of long bond wires are bonded, or tacked, to an upper surface of the lead support structure. In this manner, long bond wires are supported along their length and are mechanically constrained from flopping around and contacting (e.g., shorting to) one another.

According to an aspect of the invention, the support structure may be placed approximately midway between the edge of the die and the inner ends of the conductive package traces. In this manner, a single long bond wire will "behave" as two shorter bond wires.

According to an aspect of the invention, two-or-more support structures may be placed between the edge of the die and the inner ends of the conductive package traces. In this manner, a single long bond wire will "behave" as three-or-more shorter bond wires.

One or more lead support structures are provided for each die. In one embodiment, a plurality of line-segment-like lead support structures are provided—for example, only where needed for restraining relatively long bond wires. In another embodiment, a single ring-like support structure is provided and is disposed entirely around the periphery of the die (between the die and the inner ends of the conductive traces).

In one embodiment of the invention, the upper surface of the (one or more) lead support structure(s) is provided with bond pads, to which the long bond wires are tacked at a point along their length. Unlike traditional bonding (e.g., of a bond wire to a die), the long bond wire is not cut in this process. It is still a single long bond wire which has been tacked down, preferably using conventional wire bonding techniques, to the upper surface of the lead support structure(s).

In another embodiment of the invention, the (one or more) lead support structure(s) may be formed of an insulating material, and the long bond wires are tacked thereto with a suitable adhesive.

Alternatively, the long bond wires can be "tacked" to a top surface of a plastic lead support structure by ultrasonic bonding.

Alternatively, the lead support structure can be provided with a plurality of notches on its upper surface, each notch retaining and locating the intermediate portion of a respective bond wire.

For very long bond wire runs, one or more additional (auxiliary) lead support structures can be provided to attach the very long bond wires at additional points along their length, thereby further supporting and mechanically constraining them.

In another embodiment of the invention, a "jumper" comprising conductive traces of graduated length corresponding to the graduated gap between sides of the die and sides of the die-receiving area can be disposed, between the die and the inner ends of the package conductive traces, in the die receiving area. A first set of bond wires is connected from inner ends of the package conductive traces (e.g., lead fingers) to outer ends (towards the lead fingers) of corresponding jumper conductive traces. A second set of bond wires is, in turn, connected from the inner ends (towards the die) of the jumper conductive traces to correspond bond wire attachment points (e.g., bond pads) on the die.

According to a feature of the invention, since conductive traces can be formed to exhibit significantly lower resistance than a comparable length of bond wire, wiring resistances in the package can be minimized.

According to a feature of the invention, the lengths of the jumper conductive traces can be graduated so that the total bond wire length for connecting a package trace to a bond pad can be maintained relatively constant for all signal connections.

According to a feature of the invention, longer jumper conductive traces can be formed with a larger cross-section (either wider or thicker, or both) than shorter jumper conductive traces so that the effective resistance between inner ends of package conductive traces and die bond pads can be maintained relatively constant for all signal connections. In other words, the width and/or thickness of the jumper conductive traces can be established to provide a relatively constant resistance regardless of trace length, thereby providing substantially matched wiring resistance for each signal so connected.

Other objects, features and advantages of the invention will become apparent in light of the following description thereof.

DETAILED DESCRIPTION OF THE INVENTION

Figure 1:
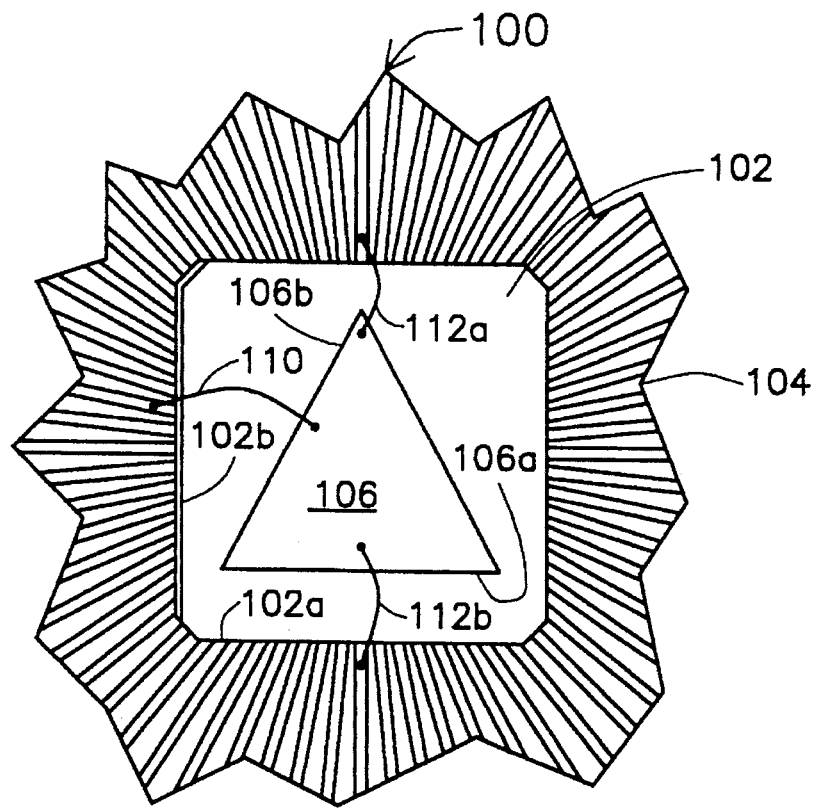
FIG. 1 is a top view of a "certain non-square" semiconductor die disposed within a rectangular die-receiving area formed by inner ends of package conductive traces (e.g., leads, fingers) surrounding (and defining) the die-receiving area.

FIG. 1 shows a "certain non-square" die 106 (triangular, in this case, but illustrative of the general case of ROS1-type dies) mounted in a substantially square, rectangular die-receiving area 102 of a semiconductor device package 100. Inner ends 104 of conductive lead fingers (package traces) extend inward towards the die receiving area, ending at the periphery of the die receiving area.

In a case, such as is shown in FIG. 1, where there is a significant mismatch between the shape of the semiconductor die (e.g., 106) and the shape of the die-receiving area, it is evident that the lengths of bond wires (110) will vary widely, from short-to-long, and that some of the bond wires will be unacceptably long. In the least, it is a reasonable goal to attempt to minimize the lengths of as many bond wires as possible. This can be accomplished in part, as shown in FIG. 1, by aligning at least one of the sides (e.g. 106a) of the die 106 with at least one side (e.g. 102a) of the die-receiving area 102. By doing this, bond wires (e.g., 112b) between conductors 104 and the die 106 along the aligned sides (e.g., 106a and 102a) of the die 106 and die-receiving area 102 are kept relatively short and relatively consistent in length. If, in addition, the die 106 is centered vertically (as depicted) within the die-receiving area 102, then some benefit (i.e., short bond wires) can be realized for connections to the die opposite the aligned side (e.g. 106a). This is illustrated in FIG. 1 by bond wire 112a connected to the point of the triangular shape of the die 106 (opposite the aligned side 106a).

Inevitably, with such a shape mismatch, at least one side of the die 106 (e.g., 106b) will not be in alignment with the nearest side (e.g., 102b) of the die-receiving area 102. This means that at least some of the bond wires (e.g., 110) connected to the die 106 along the misaligned side (e.g., 106b) will be significantly longer than others. When many long bond wires are adjacent to one another, numerous problems such as those described hereinabove (e.g., shorting, signal delays, etc.) can result.

Figure 2:
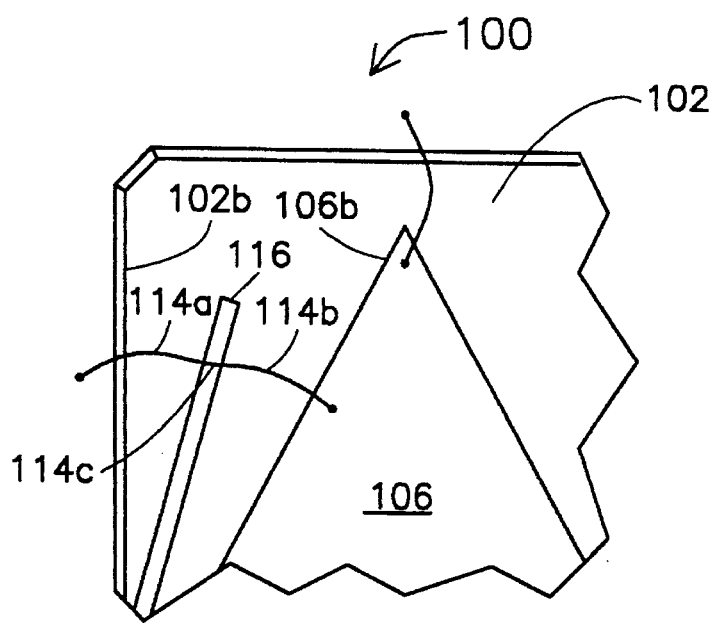
FIG. 2 is top view of a portion of a die-receiving area incorporating a lead support structure, according to the invention.

FIG. 2 illustrates an approach to solving the problems associated with excessively long bond wires. In this case a lead support structure 116 is disposed in the die-receiving area 102 of the package 100. The lead support structure 116 is positioned between the misaligned sides 106b and 102b of the die 106 and die-receiving area 102, respectively, at an angle between that of the side 102b of the die-receiving area 102 and the side 106b of the die 106, such that it is roughly half-way between the side 106b of the die 106 and the side 102b of the die-receiving area 102, as measured along the path of bond wire connections therebetween.

A representative single bond wire 114 comprising two portions 114a and 114b is connected between the die 106 and a conductive lead (not shown) of the package. At a point 114c along its length, the bond wire 114 is attached to the lead support structure 116, dividing it into two portions 114a and 114b on either side of the attachment point 114c. By securing the bond wire 114 to the lead support structure 116 at a point 114c along its length, the bond wire 114 is mechanically constrained such that it cannot short to adjacent bond wires. Details of methods of attaching bond wires (e.g., 114) to support structures (e.g. 116) are discussed in greater detail hereinbelow with respect to FIGS. 9a–c.

This technique of disposing a support structure only where needed (i.e., only for the too long bond wires) can be applied to any shape die in any shape die-receiving area on any or all sides of the die.

Figure 3:
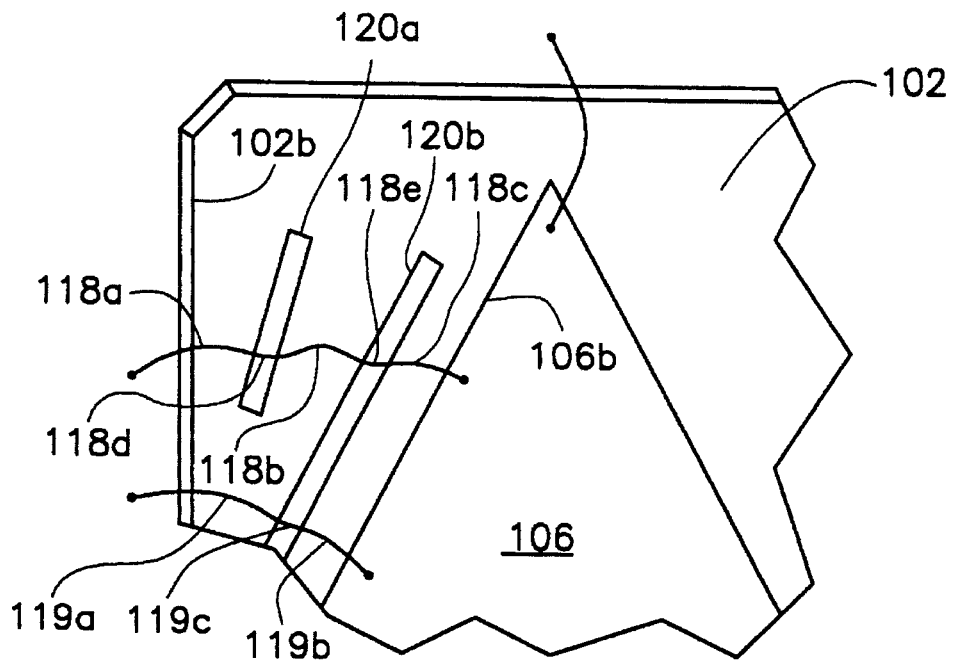
FIG. 3 is a top view of a portion of a die-receiving area incorporating a compound lead support structure, according to the invention.

FIG. 3 shows a similar (to FIG. 2) arrangement using a compound lead support structure 120 comprising two parts 120a and 120b. Towards the top (as depicted) of the gap between the misaligned sides 106b and 102b of the die and the die receiving area, respectively, the gap is widest. This means that bond wires across the widest portions of the gap are longer than bond wires across narrower portions of the gap (e.g., towards the bottom, as depicted). If a lead support arrangement such as that (116) shown in FIG. 2 were used, some bond wires, particularly towards the top of the gap, would be unsupported over relatively greater distances than others. For cases where this presents a problem that cannot be solved by a single support segment (e.g., 116), the compound support structure 120 (120a and 120b) permits very long bond wires, e.g., 118 (composed of portions 118a, 118b, and 118c) to be attached at more than one point to provide effective mechanical support and constraint. The goal is that each portion of the bond wire be within limits defined for the acceptable length of a bond wire.

The lead support structure 120 comprises first and second parts 120a and 120b, each similar to the lead support structure shown and described as 116 with respect to FIG. 2. The first part 120a is shorter than the second part 120b, and is positioned towards the top (widest part) of the gap between the misaligned sides 102b and 106b. The second support structure 120b is longer and extends through a greater portion of the gap.

A bond wire 118 (118a, 118b, and 118c), located near the top end of the gap between the misaligned sides 102b and 106b of the die and the die-receiving area is connected between the die 106 and a conductive lead (not shown, assumed) at the side 102b of the die-receiving area 102. At a first point 118d along its length, the bond wire 118 is secured to a first part 120a of the compound lead support structure 120. At a second point 118e along its length, the bond wire 118 is attached to the second part 120b of the compound lead support structure 120. The two attachment points 118d and 118e divide the bond wire 118 into three roughly equal length portions 118a, 118b and 118c, and provide mechanical support and constraint for the bond wire 118. While there are three portions to the bond wire 118, it is nevertheless a single bond wire requiring electrical connection (wire bonding) at only its two ends. The bond wire is merely "tacked" to the support structure.

Figure 9A:
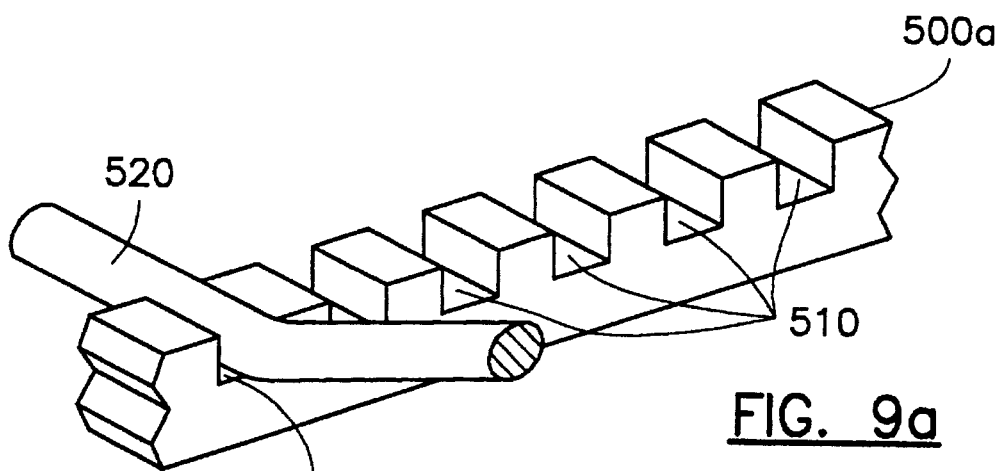
FIG. 9a is a close-up perspective view of a portion of a "comb-type" lead support structure, according to the invention.
Figure 9B:
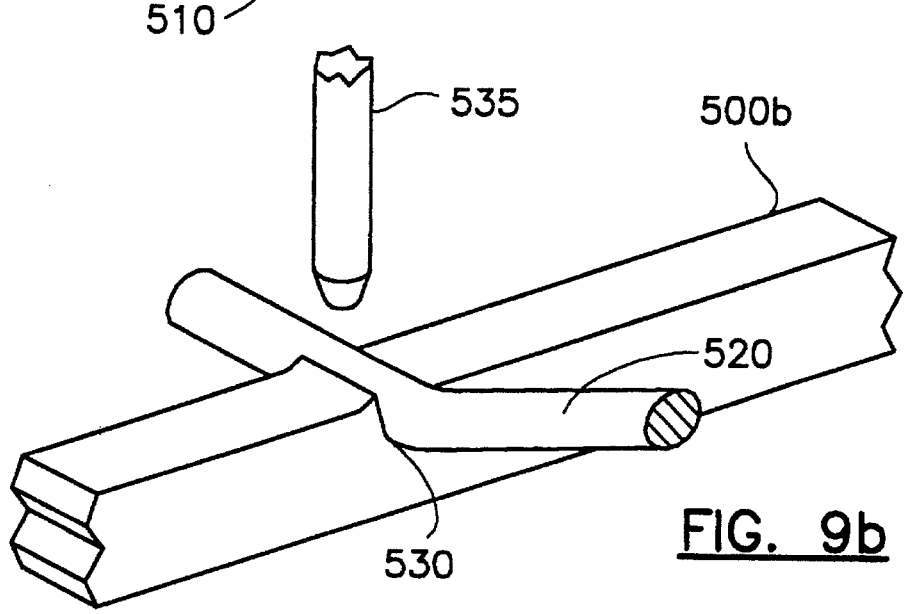
FIG. 9b is a close-up perspective view of a portion of a "flat-top" lead support structure, according to the invention.
Figure 9C:
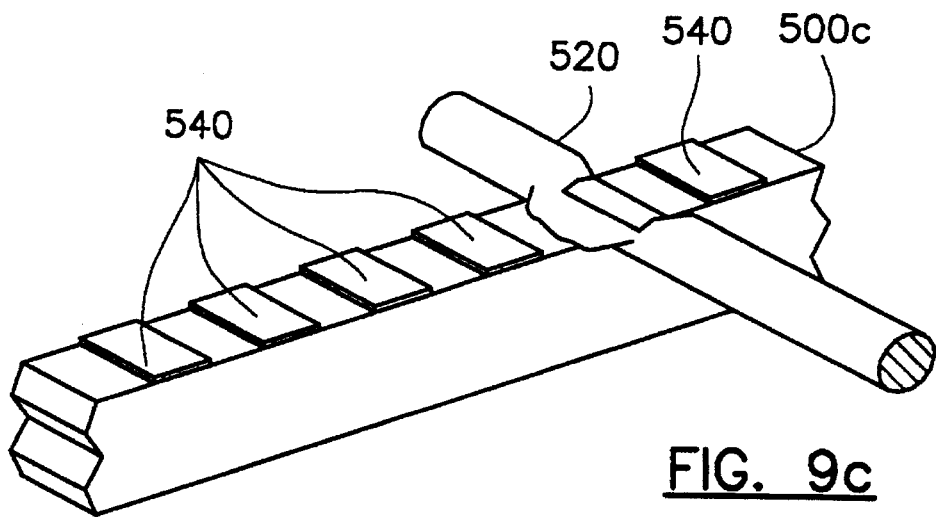
FIG. 9c is a close-up perspective view of a portion of a "bond-pad type" lead support structure, according to the invention.

Other bond wires located lower (as depicted) in the gap between the misaligned sides 102b and 106b of the die and the die-receiving area are relatively shorter and can accommodate attachment to only one lead support structure, in a manner similar to that shown in FIG. 2. This is shown in FIG. 3 with respect to a second bond wire 119 (119a and 119b) between the die 106 and a conductive lead (not shown, assumed) along the side 102b of the die-receiving area 102. The second bond wire 119 is shorter than the first bond wire 118, by virtue of its location in a narrower portion of the gap between the misaligned sides 102b and 106b. As such, it does not need as much mechanical support as the first bond wire 118. At one point 119c along its length, the bond wire 119 is attached to the second part 120b of the compound lead support structure 120, dividing it into two roughly equal length portions (segments) 119a and 119b. The second part 120b of the lead support structure 120, by extending lower into the gap than the first part 120a, provides attachment points (e.g., 119c) and mechanical support for bond wires (e.g., 119) which are long enough to require mechanical constraint, but which are not long enough to require constraint at two points. Other bond wires (not shown) located even lower in the gap (out of the view of FIG. 3) may be short enough not to require any mechanical support at all. As was the case with the support structure of FIG. 2, particulars of tacking the bond wires to the support structure(s) are shown in FIGS. 9a–9c.

While the lead support structures described hereinabove with respect to FIGS. 2 and 3 are directed to supporting bond wires at a point (or points) along their length, without "breaking" the single bond wire, an alternative approach involves using a "jumper" having graduated-length conductive traces.

Figure 4:
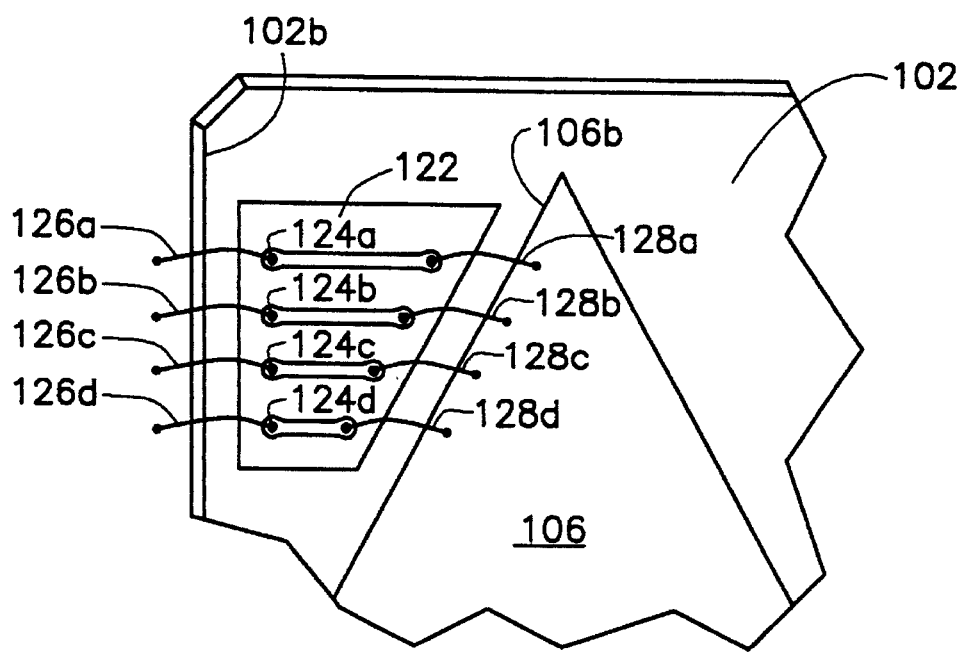
FIG. 4 is a top view of a portion of a die-receiving area incorporating a "jumper" with graduated-length intermediate conductors (jumper conductive traces), according to the invention.

FIG. 4 shows an alternative method of adapting the "certain non-square" ROS1-type die 106 to the square or low aspect ratio rectangular die-receiving area 102. In the Figure, a jumper structure 122 having four conductive traces 124a, 124b, 124c, and 124d is disposed in the die-receiving area between the misaligned sides 102b and 106b of the die-receiving area 102 and die 106, respectively.

A first connection is made between conductive traces of the package (not shown) and the jumper structure 122 by means of a bond wire 126a connected to a conductive lead (not shown) along the side 102b of the die-receiving area and to one end of a first conductive trace 124a of the jumper. The other end of the first conductive trace 124a is connected to the die 106 by means of a second bond wire 128a. This differs significantly from the embodiments of FIGS. 2 and 3 in that two (essentially in series) bond wires are required to make a single connection to the die.

In like manner, a second connection is made between the package and the die 106 by means of a bond wire 126b connected to another conductive lead (not shown) along the side 102b of the die-receiving area and to one end of a second conductive trace 124b of the jumper structure 122. The other end of the second conductive trace 124b is connected to the die 106 by means of another bond wire 128b.

In like manner a third connection is made between the package and the die by means of a bond wire 126c connected to another conductive lead (not shown) along the side 102b of the die-receiving area and to one end of a third conductive trace 124c of the jumper structure 122. The other end of the third conductive trace 124c is connected to the die 106 by means of another bond wire 128d.

In like manner, a fourth connection is made between the package and the die by means of a bond wire 126d connected to another conductive lead (not shown) along the side 102b of the die-receiving area and to one end of a fourth conductive trace 124d of the jumper structure 122. The other end of the fourth conductive trace 124d is connected to the die 106 by means of another bond wire 128d.

It will be observed that each of the first through fourth exemplary connection paths, from the package to the die, is shorter than the preceding connection. This is amply evident in the illustration of FIG. 4. This can be used to great advantage in the packaging of semiconductor dies that mismatch the die-receiving areas into which they are disposed.

The length of each conductive trace (124a–d) is preferably established so that the total (of the two for each connection to the die) bond wire length for all connection paths is approximately the same. As shown in FIG. 4, the conductive traces of the jumper structure are sized so that the bond wire segments for each connection to the die is the same.

Since conductive traces (and leads) can have resistance per-unit-length which can be (and typically is) lower than that of the relatively thin bond wires, this connection technique (i.e., of FIG. 4) has the effect of lowering the overall connection resistance to the die (thereby reducing delays). Further, it is possible to establish the thickness (height) or width of the conductive traces (124a–d) in accordance with their length to keep their resistances (cross-section times length) approximately equal to one another (i.e., longer jumper traces would be thicker or wider). This has the benefit of providing substantially matched overall resistances from the package to the die for each signal on the die which is connected in this manner, thereby helping to match signal delays due to parasitic capacitances.

The jumper structure 122 can be a discrete structure which is disposed (such as by an adhesive) in the die-receiving area.

In the embodiments of FIGS. 2–4, described hereinabove, and in the embodiments that follow, only a few of many bond wires are shown, for illustrative clarity. The general goal of using certain non-square dies being increasing the I/O count for dies of a given area, it would be impractical to illustrate the hundreds of connections that the present invention facilitates.

As mentioned hereinabove, a principal goal of the present invention is to "adapt" conventional (e.g., square die-receiving areas) packages to non-conventional (e.g., certain non-square) dies. This would allow integrated circuit device manufacturers to employ certain-non-square dies without re-tooling their packages.

The invention has great utility in any case where there is a mismatch between the shape of the die and the shape of the die-receiving area, whether or not certain non-square dies are being disposed in square die-receiving areas, and is also of use in any case where a portion or all of the bond wire lengths are unacceptably long.

Figure 5:
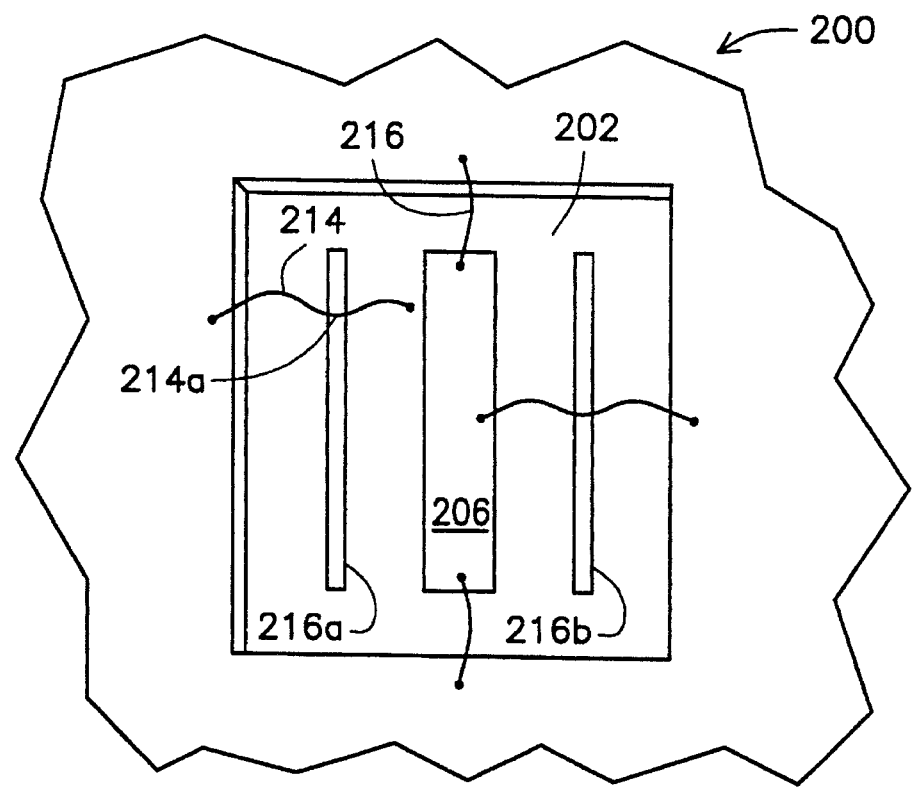
FIG. 5 is a top view, of a greatly-elongated rectangular semiconductor die mounted in a substantially square die-receiving area incorporating lead support structures, according to the invention.

FIG. 5 shows an arrangement 200 wherein a greatly-elongated rectangular die 206 is disposed in a substantially square die-receiving area 202. The die 206 is disposed in a substantially centered position in the die-receiving area 202, such that bond wire connections, e.g., 216, to the top and bottom edges (as depicted) of the die 206 are short enough not to require mechanical support. Bond wires, e.g., 214, connected to the left and right sides (as depicted) of the die 206, however, are quite long, and require mechanical support to prevent shorting with adjacent bond wires (not shown). To this end, lead support structures 216a and 216b (similar to 116) are disposed roughly in the center of the gaps on the left and right sides (as depicted), respectively, of the die 206, between the die 206 and the edges of the die-receiving area 202. A representative long bond wire 214 is shown forming a connection to the left side (as depicted) of the die 206. The bond wire 214 is attached (tacked, in a manner described hereinbelow) at a point 214a along its length to the lead support structure 216a, thereby providing mechanical support and constraint for the bond wire 214 and preventing shorting to any adjacent bond wires (not shown).

It will readily be appreciated by one of ordinary skill in the art, that although the lead support scheme shown in FIG. 5 is similar to that shown and described with respect to FIG. 2, the techniques described with respect to FIGS. 3 and 4 may also be applied to this situation.

Figure 6:
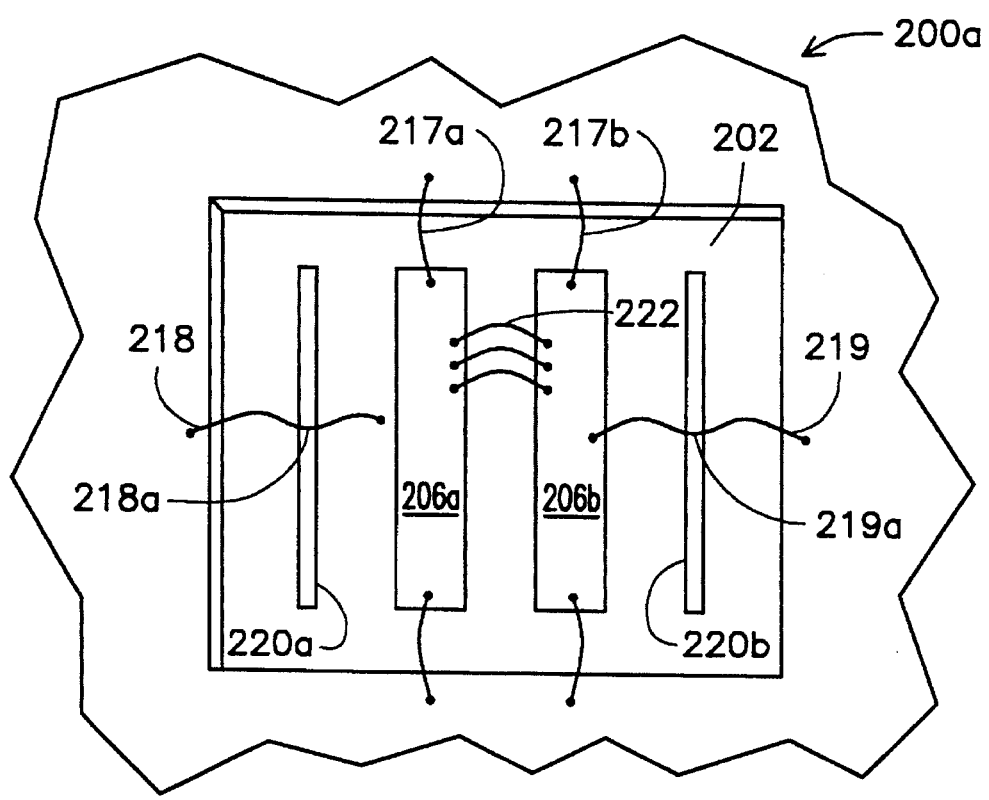
FIG. 6 is a top view of a die-receiving area showing a technique for mounting and connecting to two greatly-elongated rectangular dies, according to the invention.

FIG. 6 shows an alternative arrangement 200a whereby substantial advantage is taken of the shape of the generally square die-receiving area 202 to accommodate two greatly elongated rectangular dies 206a and 206b. It is assumed that the design (and functionality) of the dies 206a and 206b is such that inter-die connections 222 are arranged along adjacent sides of the dies 206a and 206b. The dies 206a and 206b are positioned sufficiently close to one another that no mechanical support is required for the inter-die connections 222. In a manner similar to that shown in FIG. 5, the dies 206a and 206b are disposed in a substantially centered vertical (as depicted) position in the die-receiving area 202, permitting unsupported bond wire connections (e.g., 217a and 217b) to the top and bottom (as depicted) edges of the dies 206a and 206b. First and second lead support structures 220a and 220b are provided to the left (as depicted) of die 206a and to the right (as depicted) of die 206b, respectively, in the die-receiving area 202 between the dies (206a, 206b) and the right and left sides (as depicted) of the die-receiving area 202. A representative bond wire 218, connected to the left (as depicted) die 206a is supported (attached) at a point 218a along its length by first lead support structure 216a. Another representative bond wire 219, connected to the right (as depicted) die 206b is supported (attached) at a point 219a along its length by the second lead support structure.

As with FIG. 5, it will be readily appreciated by one of ordinary skill in the art, that although the lead support scheme shown in FIG. 6 is similar to that shown and described with respect to FIG. 2, the techniques for shortening "effective" bond wire length described with respect to FIGS. 3 and 4 may also be applied in this situation.

Figure 7:
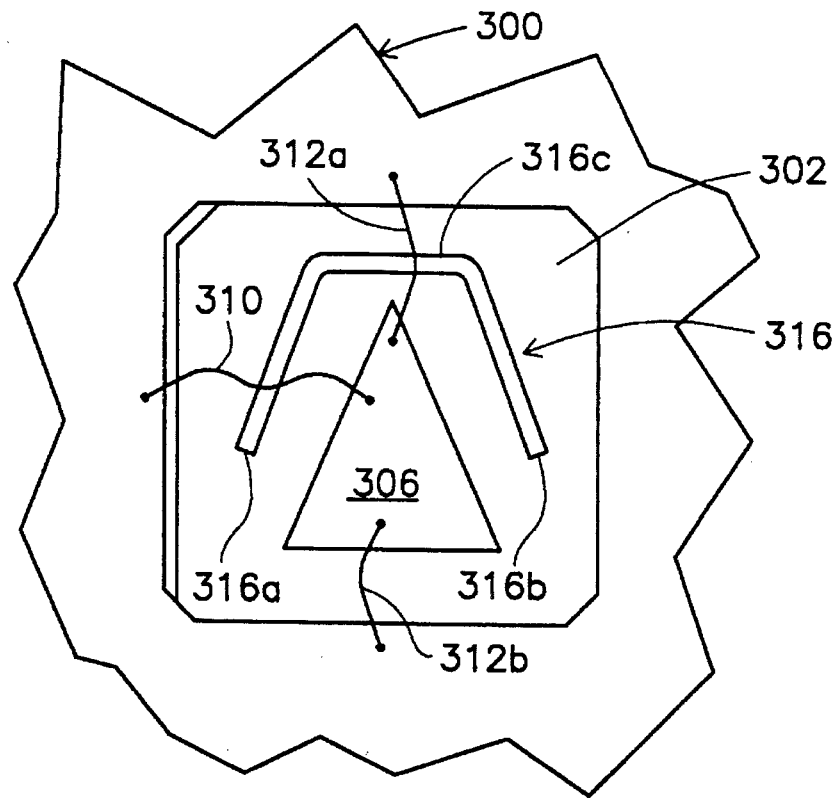
FIG. 7 is a top view of a portion of a semiconductor device package showing a one-piece lead support structure, according to the invention.

FIG. 7 shows a portion of an integrated circuit package 300 wherein a "certain non-square" ROS1-type die 306 is disposed within a substantially square die-receiving area 302, with one side (the bottom side, as depicted) of the die 306 aligned with one side (also the bottom side, as depicted) of the die-receiving area, such that bond wires, e.g., 312b, between the aligned sides are sufficiently short that no supplementary mechanical support is required. A one-piece lead support structure 316 is disposed in the die receiving area 302 around the die 306. The lead support structure includes two support legs 316a and 316b connected by a cross member 316c. Generally, whereas the FIG. 2 embodiment generally contemplated using a number of distinct support structures in various areas around the die where bond wire lengths are (by definition) too long, in this embodiment a single support structure "embraces" two areas around the die where bond wire lengths are (by definition) too long.

A representative bond wire 310 is shown connected to the die 306 and supported (attached) approximately midway along its length by one of the support legs 316a. A bond wire 312a connected (tacked) to the top (as depicted) of the die 306, is sufficiently short that no mechanical constraint is required, and the bond wire 312a need not be attached to the cross-member 316c. This embodiment has the advantage that if there are two "distinct" areas where bond wires need to be tacked to a support, one support structure can be disposed around (or partially around) the die to subsume the critical areas.

It is within the spirit and scope of the present invention that any of the support structures described hereinabove be provided in the form of a single-piece unit. For example, the compound lead support structure shown and described with respect to FIG. 3 can be readily adapted to a single-piece structure extending around more than one side of a semiconductor die simply by providing one or more cross-members to connect the various parts of the compound lead support structure.

Figure 8:
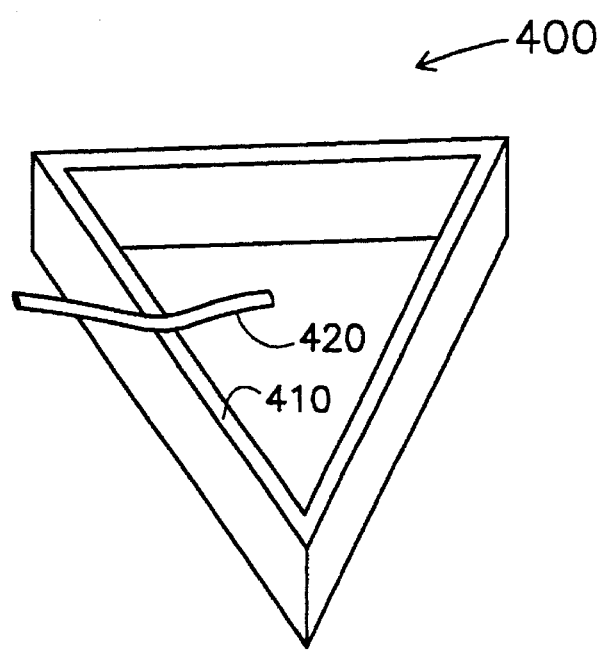
FIG. 8 is a perspective view of another embodiment of a one-piece lead support structure, according to the invention.

Alternatively, a single-piece lead support structure can be provided in the form of a ring-like structure disposed completely around a semiconductor die. Such a structure is shown and described with respect to FIG. 8. A ring-like lead-support structure 400 is formed in a shape designed to surround a semiconductor die. Bond wires, of which 420 is representative, are affixed to the top surface 410 of the lead-support structure 400, by any suitable method. Again, this embodiment has the advantage that if there are several areas where bond wires need to be tacked to a support, one support structure can be disposed around the die to subsume the critical areas. Additionally, by using a complete ring-like support structure, the support structure is readily disposed symmetrically about the die. (In contrast, if three individual support structures were disposed about the periphery of a triangular die, each would have to be accurately positioned, individually.)

Having described various forms and configurations of lead-support structures for adapting conventional packages with square or near-square die-receiving areas to "certain non-square" ROS1-type dies, attention is now directed to various techniques for affixing bond wires to lead support structures are next described with respect to FIGS. 9a–9c. The techniques for tacking a bond wire to a support structure shown in FIGS. 9a–9c are applicable to all but the FIG. 4 embodiments described hereinabove. In each case, a long bond wire, electrically bonded at its two ends (to package traces and to the die) is somehow tacked to a support structure, so that it behaves as two (or more) shorter bond wires, without breaking the bond wire or necessitating additional electrical bonds.

FIG. 9a shows a broken away portion of a lead-support structure 500a. In this case, the upper surface of the support means is provided with a plurality of grooves (notches) 510, at least one per bond wire, for locating and retaining intermediate portions of the bond wires, of which the bond wire 520 is representative. To this end, the grooves 510 are wide enough and deep enough to form a slight interference fit with the bond wire 520, i.e. on the order of one thousandth of an inch (or less, depending on the diameter of the bond wire). In this manner, the bond wires are directly mechanically supported (tacked to the support structure). Given that the die to which the bond wires are connected is ultimately encapsulated in plastic (for molded plastic packages), or covered with a glob top epoxy (for tape-based packages), the plastic (or epoxy) will further fix the bond wires (e.g., 520) into the notches 510.

FIG. 9b shows another approach to affixing (tacking) the bond wire 520 to a different type of lead support structure 500b. However, in this case, the lead support structure 500b is formed of a plastic material, such as nylon, with a substantially flat (un-grooved) top surface. The bond wire 520 is bonded at a point 530 to the lead support structure 500b in any suitable manner, such as by ultrasonic bonding to the upper surface of the lead support structure 500b. This is indicated by the tip 535 of an ultrasonic bonding tool positioned above the bond wire 520. Alternatively, a dollop of adhesive (not shown) may also be used to tack the bond wire 520 to the upper surface of the lead support structure 500b.

Another approach to tacking the bond wire 520 uses still another type of lead support structure 500c, as shown in FIG. 9c. A number of metallic pads 540, at least one per bond wire, are disposed on the top surface of the lead support structure 500c. These bond pads 540 may be similar to the bond pads on die (not shown), in that they may simply be solder areas. In this manner, an intermediate portion of the bond wire 520 can be tacked to the lead support structure 500c using similar techniques as are employed for bonding the ends of the bond wire to the die and lead fingers (not shown), respectively. This technique has the advantage that the same apparatus which is used to connect the bond wire 520 to the die and lead fingers can be used to attach the bond wire 520 to the lead support structure 500c, thereby saving complexity, tool changes, and time.

For any of the lead-support structures described hereinabove with respect to FIGS. 2, 3, 5, 6, 7, and 8, the bond wire attachments may be accomplished using any of the attachment techniques described hereinabove with respect to FIGS. 9a–9c.

It will be readily appreciated by one of ordinary skill in the art that the techniques described hereinabove, while described for "certain non-square" dies assembled in square or low-aspect ratio rectangular die-receiving areas, are equally suited to assemblies of a die of any shape to a die-receiving area having a substantially different shape from that of the die.

What is claimed is:

1. A method of connecting a semiconductor die in a semiconductor package, comprising the steps of:

providing a semiconductor die having a plurality of bond pads on a face thereof;

providing a semiconductor package having conductive traces with inner ends thereof defining a die receiving area;

placing the semiconductor die in the die receiving area;

providing at least one support structure between the semiconductor die and at least a portion of the conductive traces, the support structure having notches disposed therein; and connecting bond wires between the die bond pads and the inner ends of the conductive traces, wherein at least one of the bond wires is placed in at least one of the notches of the support structure.

2. The method according to claim 1, wherein the die receiving area defined by the inner ends of the conductive traces has a different shape than the semiconductor die.

3. The method according to claim 1, wherein some of the bond wires are not placed in the notches of the support structure.

4. The method according to claim 1, wherein at least two support structures are between the semiconductor die and at least a portion of the conductive traces.

5. The method according to claim 1, wherein the bond wires in the notches are attached to the support structure.

6. The method according to claim 1, wherein the support structure notches have an inside width slightly smaller than the outside diameter of the bond wires, and the bond wires are attached to the support structure by press fitting the bond wires into the notches.

7. The method according to claim 1, wherein the bond wires are attached to the support structure ultrasonically.

8. The method according to claim 1, wherein the bond wires are attached to the support structure with adhesive.

9. The method according to claim 1, wherein at least two support structure are between different sides of the semiconductor die and portions of the conductive traces.

10. The method according to claim 9, wherein the at least two support structure are joined together.

11. The method according to claim 1, wherein the at least one support structure surrounds the semiconductor die.

\* \* \* \* \*